(12) United States Patent
Riley et al.

(10) Patent No.: US 11,908,509 B2
(45) Date of Patent: Feb. 20, 2024

(54) APPARATUS WITH INPUT SIGNAL QUALITY FEEDBACK

(71) Applicant: Micron Technology, Inc., Boise, ID (US)

(72) Inventors: John E. Riley, McKinney, TX (US); Scott E. Smith, Plano, TX (US); Jennifer E. Taylor, Boise, ID (US); Gary L. Howe, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 17/701,950

(22) Filed: Mar. 23, 2022

(65) Prior Publication Data

US 2023/0307033 A1    Sep. 28, 2023

(51) Int. Cl.
*G11C 11/4076* (2006.01)
*G11C 11/4096* (2006.01)

(52) U.S. Cl.
CPC ...... *G11C 11/4076* (2013.01); *G11C 11/4096* (2013.01)

(58) Field of Classification Search
CPC .................. G11C 11/4076; G11C 11/4096
See application file for complete search history.

(56) References Cited

U.S. PATENT DOCUMENTS

| | | | | |
|---|---|---|---|---|
| 5,150,266 A * | 9/1992 | Albert | .................. | G11B 5/5547 360/78.07 |
| 8,264,906 B2 * | 9/2012 | Chiu | .................... | G11C 7/1072 365/194 |
| 2018/0276516 A1 * | 9/2018 | Ahn | .................. | G11C 7/10 |

* cited by examiner

*Primary Examiner* — Sultana Begum
(74) *Attorney, Agent, or Firm* — Perkins Coie LLP

(57) ABSTRACT

Methods, apparatuses, and systems related to operations for managing the quality of an input signal received by a device and for providing feedback in real-time. A controller can provide a reference signal to the device for the input quality check. The memory can implement the input quality check by counting the number of transitions of the reference signal for a set time period and store the resulting count value(s). The memory can use the count value(s) to determine a condition or a quality for the reference signal.

20 Claims, 8 Drawing Sheets

APPARATUS WITH INPUT SIGNAL QUALITY FEEDBACK

TECHNICAL FIELD

The disclosed embodiments relate to devices, and, in particular, to semiconductor memory devices with input signal quality feedback.

BACKGROUND

An apparatus (e.g., a processor, a memory device, a memory system, or a combination thereof) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data. The memory devices can include Double Data Rate (DDR) RAM devices that implement DDR interfacing scheme (e.g., DDR4, DDR5, etc.) for high-speed data transfer.

With technological advancements in various areas and increasing applications, the market is continuously looking for faster, more efficient, and smaller devices. To meet the market demand, the semiconductor devices are being pushed to the limit. However, attempts to increase the operating speed and/or to decrease the circuit size often create other issues, such as degraded signal qualities, increased noise, and increased processing errors. In view of the ever-increasing commercial competitive pressures, along with growing consumer expectations and the desire to differentiate products in the marketplace, it is increasingly desirable that answers be found to these problems. Additionally, the semiconductor devices must protect against unauthorized uses or accesses that are also becoming more sophisticated with the technological advancements. Moreover, the need to reduce costs, improve efficiencies and performance, and meet competitive pressures adds an even greater pressure to find answers to these problems.

DETAILED DESCRIPTION

As described in greater detail below, the technology disclosed herein relates to an apparatus, such as a memory system, a system with one or more memory devices, a memory controller, a related method, etc., for managing memory-internal operations. In some embodiments, the apparatus may be configured to manage the quality of an input signal received by a memory device and providing feedback in real-time. The apparatus (e.g., a memory system/device, such as a DRAM, a controller, etc.) can adjust the input buffer bias level in real-time to determine the strength of a clock signal. For example, during system initiation/initialization, a controller can trigger an input quality check (e.g., a handshake, a sequence of steps, etc.) for signals used to communicate with the memory. The controller can provide a reference signal (e.g., a clock signal) to the memory for the input quality check. The memory can begin the input quality check by counting the number of transitions of the reference signal for a set time period and store the count value. The stored count value can serve as a reference value for an initial setting (e.g., a reference clock speed, a reference termination setting, a biasing level for an input buffer, and/or the like) to compare to values corresponding to additional predetermined settings. The memory can compare the count values resulting from different predetermined communication settings to determine a communication condition. The determined condition can be used (via, e.g., the memory, the controller, the processor, or a combination thereof) to make additional adjustments to the communication settings, such as input buffer bias levels.

For illustrative purposes, embodiments of the present technology are described using clock signals exchanged between the controller and the DRAM memory. However, it is understood that the present technology can be implemented differently. For example, the input signal quality check/feedback described below can be implemented for different circuit combinations, such as between processors or between separately housed/encased circuits. Also for example, the input signal quality check/feedback described below can be implemented for other types of signals, such as data signals, enable/timing signals, etc.

Figure 1A:
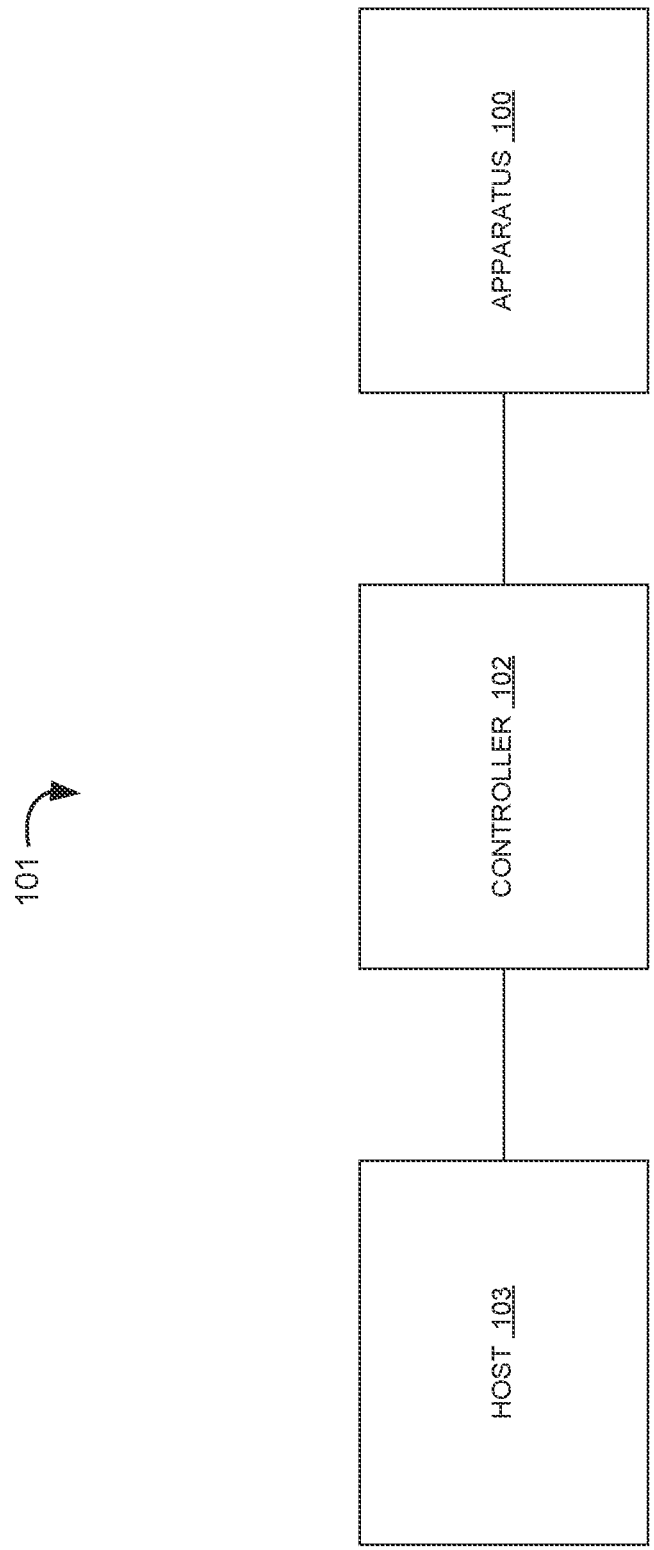
FIG. 1A is a block diagram of an example environment in which an apparatus may operate in accordance with an embodiment of the present technology.

FIG. 1A is a block diagram of an example environment 101 in which an apparatus 100 may operate in accordance with an embodiment of the present technology. The example environment 101 can correspond to a computing device or system. As described in detail below, the apparatus 100 can include a memory device or system, such as a volatile memory, a non-volatile memory, or a combination device/system. For example, the apparatus 100 can include a DRAM.

The apparatus 100 can be electrically coupled to an apparatus controller 102 (e.g., a memory controller, a buffer, a repeater device, such as an RCD, etc.) and a host 103 (e.g., one or more processors). Some example operating environments can include a computing system having a central processing unit (CPU) as the host 103 interacting with a memory controller to write data to and read data from a DRAM (the apparatus 100). The host 103 can function according to an operating system and send operational communications (e.g., read/write commands, write data, addresses, etc.) to the memory controller. The apparatus 100 can also send read data back to the apparatus controller 102 as the operational communications. The apparatus controller 102 can manage the flow of the data to or from the apparatus 100 according to the address and/or the operation.

Figure 1B:
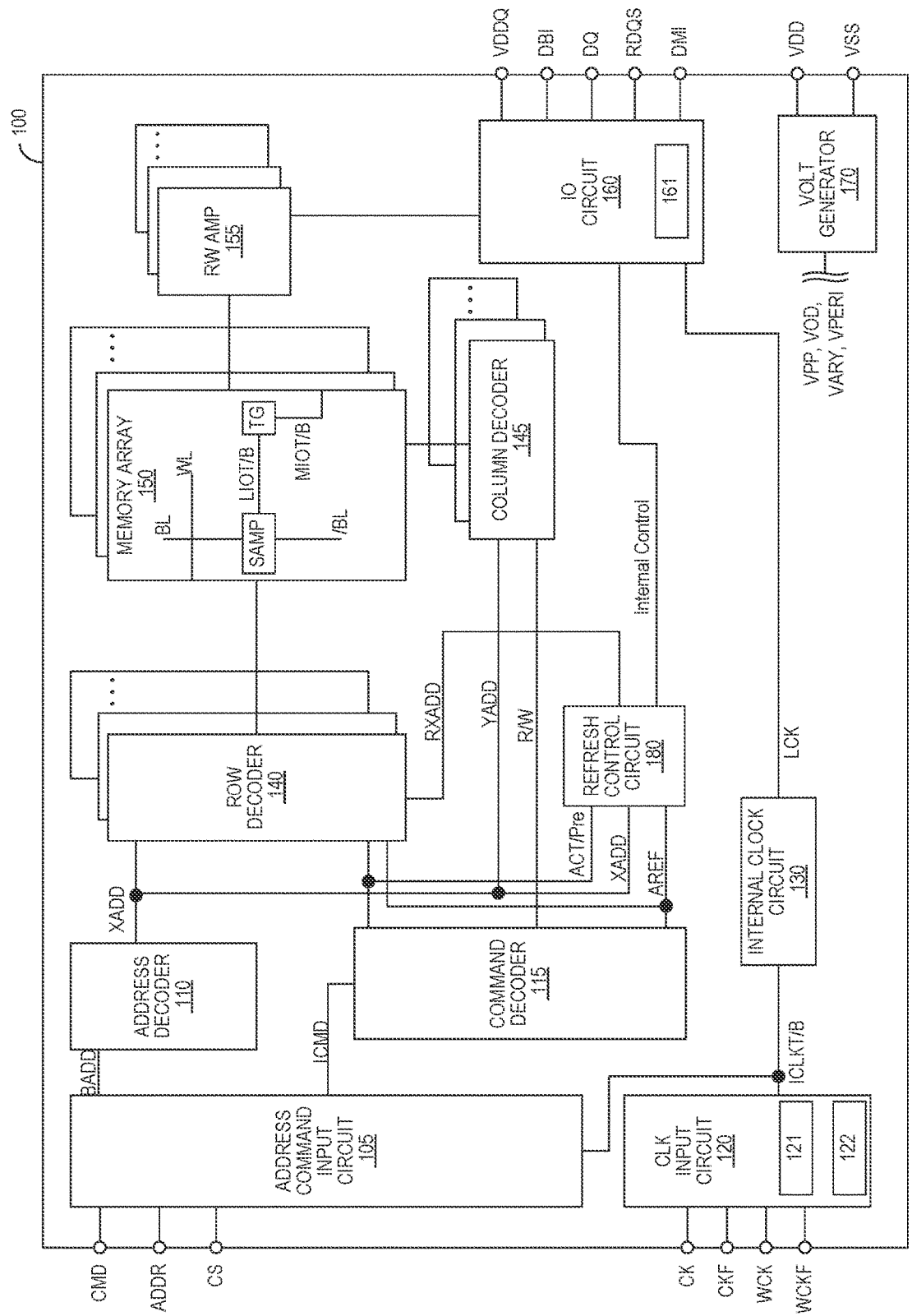
FIG. 1B is a block diagram of an apparatus in accordance with an embodiment of the present technology.

FIG. 1B is a block diagram of the apparatus 100 (e.g., a semiconductor die assembly, including a 3DI device or a die-stacked package) in accordance with an embodiment of the present technology. For example, the apparatus 100 can include a DRAM (e.g., DDR4 DRAM, DDR5 DRAM, LP DRAM, HBM DRAM, etc.), or a portion thereof that includes one or more dies/chips. In some embodiments, the apparatus 100 can include synchronous DRAM (SDRAM) of DDR type integrated on a single semiconductor chip.

The apparatus 100 may include an array of memory cells, such as memory array 150. The memory array 150 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 1) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

Figure 3:
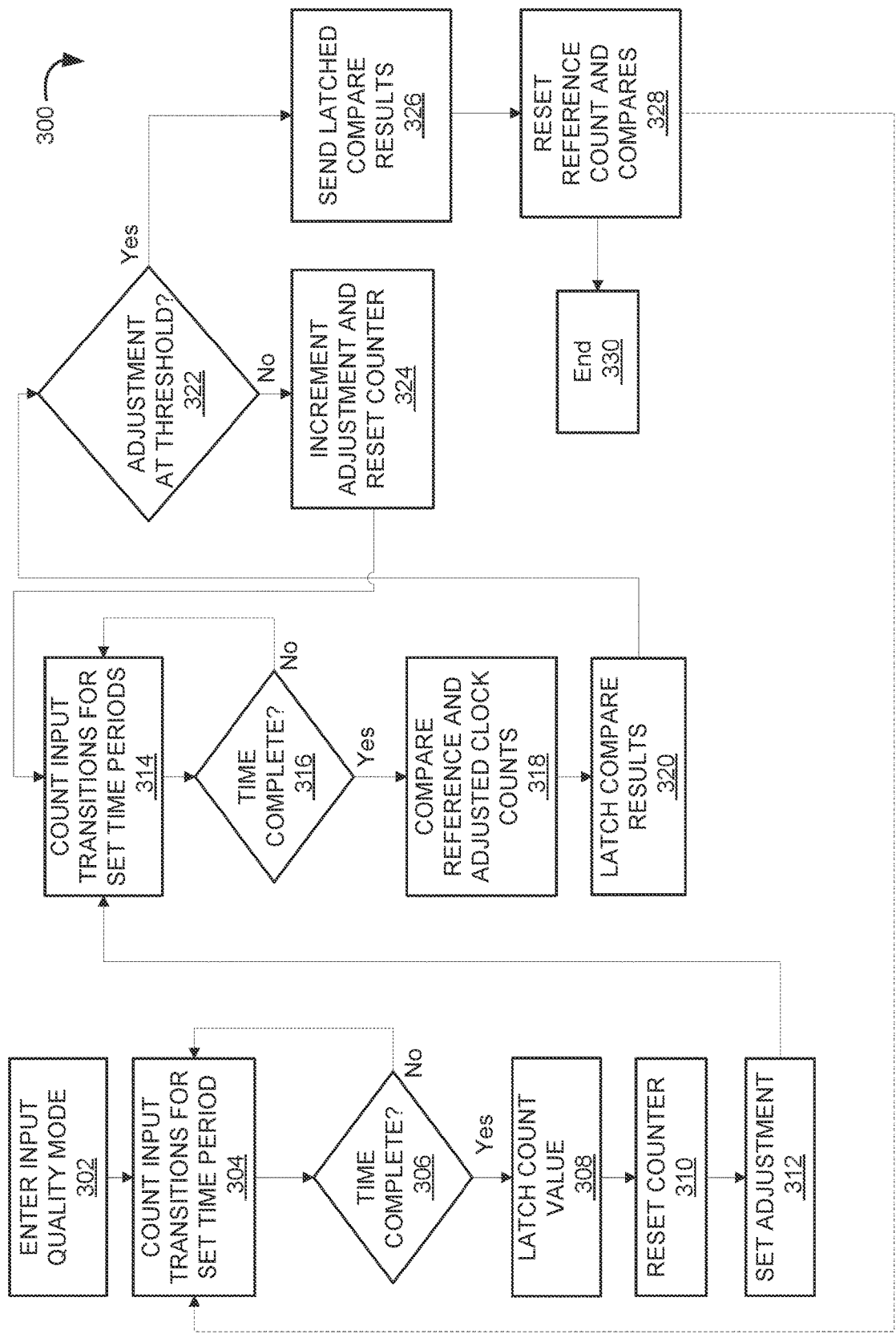
FIG. 3 is a flow diagram illustrating an example method of operating an apparatus for the input quality check and feedback in accordance with an embodiment of the present technology.

The command and address terminals may be supplied with command signals (CMD), address signals (ADDR), and chip select signals (CS), from a memory controller (e.g., the apparatus controller 102 of FIG. 3). The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the apparatus 100, for example, in a mode register (not shown in FIG. 1). The read latency information RL can be defined in terms of clock cycles of the CK clock signal. For example, the read latency information RL can be a number of clock cycles of the CK signal after the read command is received by the apparatus 100 when the associated read data is provided.

Write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register (not shown in FIG. 1). The write latency WL information can be defined in terms of clock cycles of the CK clock signal. For example, the write latency information WL can be a number of clock cycles of the CK signal after the write command is received by the apparatus 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers (e.g., communication buffer 121) included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1) from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The 10 clock signals can be supplied to the input/output circuit 160 and can be used as a timing signal for determining an output timing of read data and the input timing of write data. The 10 clock signals can be provided at multiple clock frequencies so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator and thus various internal clock signals can be generated.

Communication buffer 121 can receive an input signal from an external controller. The apparatus 100 can count the number of input transitions for a predetermined duration, adjust the buffer bias level, reset the counter, and repeat the count of the input transitions with the adjusted bias level. The clock input circuit 120 can include counter circuit 122 to increment the adjustment to the buffer bias level. Latch 161 in 10 circuit 160 can store the count results (e.g., clock pulse counts). The 10 circuit 160 can output the results to the external controller via an output communication path (e.g., DQ output path). Details regarding the input quality check mode is described below.

The apparatus 100 can be connected to any one of a number of electronic devices capable of utilizing memory for the temporary or persistent storage of information, or a component thereof. For example, the host device and the apparatus 100 may be included in a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.).

The apparatus 100 can include a refresh control circuit 180 configured to control refreshing of the information of the corresponding memory cell MC. For example, as inputs, the refresh control circuit 180 can receive the decoded row address signal (XADD) from the address decoder 110, a refresh signal (AREF) from the command decoder 115, an active signal (ACT) and/or a precharge signal (Pre) from the command decoder 115, etc. The command decoder 115 can generate the active signal (ACT) (e.g., a pulse signal) when the command signals (CMD) indicates row access (e.g., active command). The command decoder 115 can generate the precharge signal (Pre) (e.g., a pulse signal) when the command signal (CMD) indicates pre-charge. The command decoder 115 can generate the refresh signal (AREF) (e.g., a pulse signal) when the command signal (CMD) indicates an auto-refresh command and/or a self-refresh entry command. In response to the self-refresh entry command, the refresh signal (AREF) can be activated cyclically at a desired interval until a self-refresh exit command is received. In some embodiments, in response to the refresh signal (AREF), the refresh control circuit 180 can generate a refresh row address (RXADD) to the row decoder 140, which initiates the refresh operation therein (e.g., by activating a predetermined word line in the memory cell array. Accordingly, the apparatus 100 can implement a refresh operation (e.g., scheduled refreshes) to refresh (e.g., increase stored charges) targeted locations.

Figure 1C:
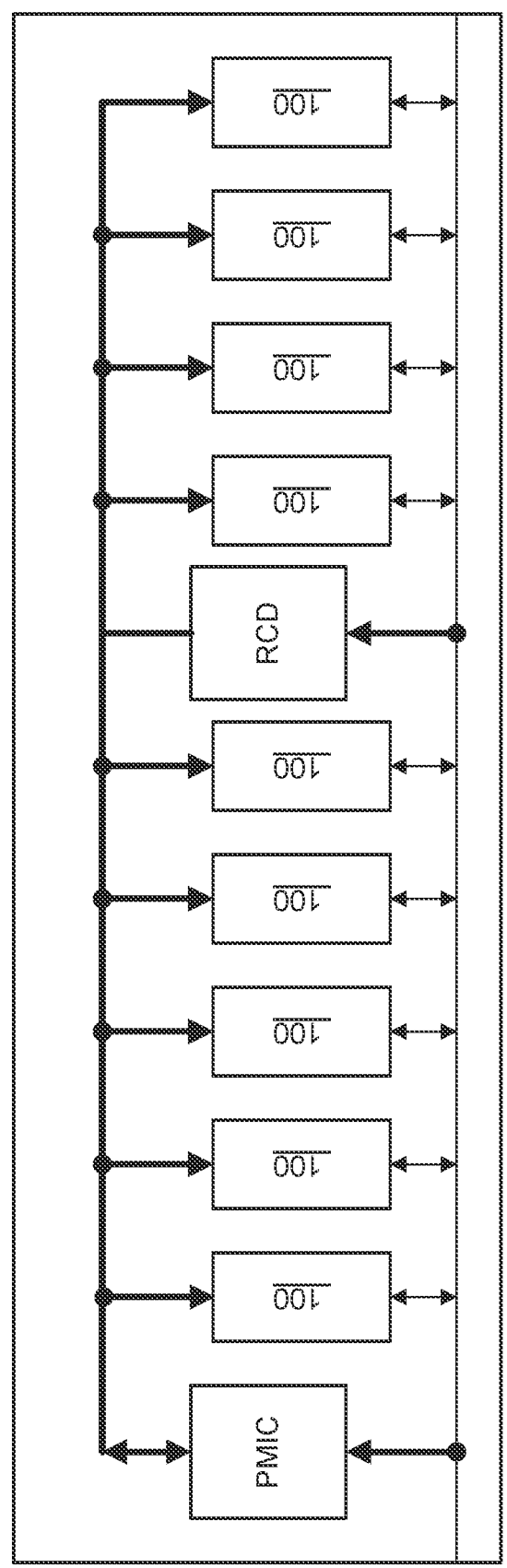
FIG. 1C is a block diagram of a further example environment in which an apparatus may operate in accordance with an embodiment of the present technology.

FIG. 1C is a block diagram of a further example environment in which an apparatus may operate in accordance with an embodiment of the present technology. FIG. 1C schematically illustrates a memory module (e.g., a dual in-line memory module (DIMM) that includes a plurality of DRAM (e.g., the apparatus 100). The memory module can include an edge connector along an edge of a substrate (e.g., a printed circuit board (PCB) or the like) for connecting one or more communication buses (illustrated in bold lines) to a host device. The buses can include (1) a data bus that conveys data signals during memory access operations (e.g., reads and writes) and/or (2) a service bus that conveys information associated with the data communicated over the data bus. For example, the service bus can include a command bus and/or an address bus.

The memory module can further include control circuitry, such as a registering clock driver (RCD). The RCD can include circuitry configured to receive command/address signals from the service bus and generate memory command/address signals for the DRAM.

The DIMM 100 can further include a power management circuitry, such as a power management integrated circuit (PMIC). For example, DDR5 DIMM can include the PMIC that receives external power (e.g., 12V) and distributes internal voltage (e.g., 1.1V VDD supply).

In some embodiments, the apparatus 100, the RCD, the host 103, the controller 102, or a combination thereof can include circuitry configured to adjust or tune communication circuits in real-time to accommodate communication conditions. For example, the address-command input circuit 105, the clock input circuit 120, the 10 circuit 160, or a combination thereof on each of the apparatus 100 can include analog and/or digital circuitry configured to implement an input signal quality check and provide corresponding feedback and/or adjustments. The corresponding circuitry may include logic and/or firmware configured to implement and manage the overall quality check process, a set of adjustable buffers configured to receive input signal (e.g., a clock input buffer), one or more registers and/or latches to store intermediate processing results (e.g., clock pulse counts), and/or an output communication path (e.g., DQ output path). Also, the host 103, the controller 102, and/or the RCD can include circuitry configured to complement and interact with the quality check circuit of the apparatus 100 to establish system-wide communication settings, such as between the apparatus 100, the controller, 102, the host 103, the RCD, or a combination thereof. Details regarding the quality check are described below.

Figure 2:
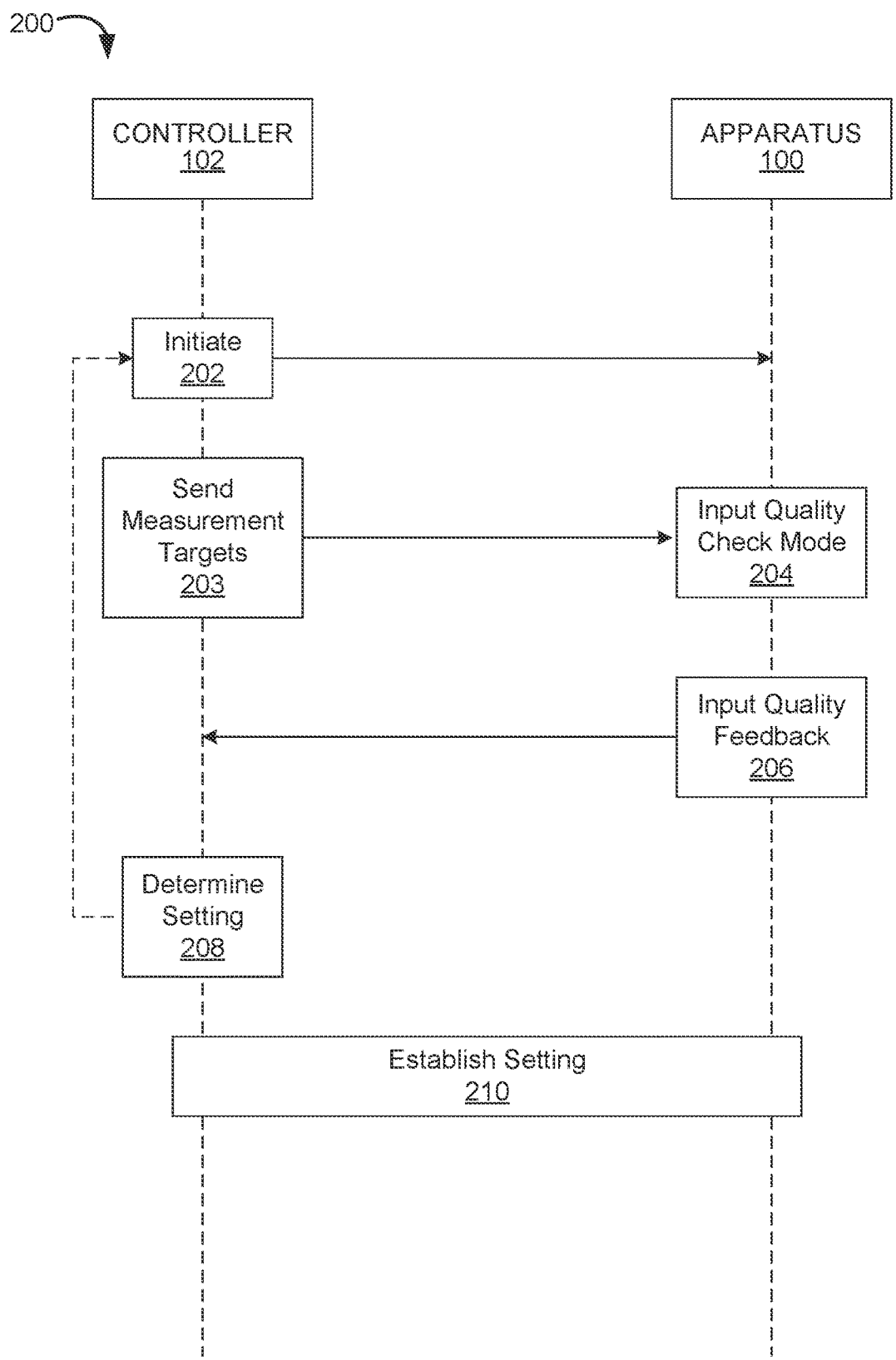
FIG. 2 is a flow diagram illustrating an example method of operating devices for an input quality check and feedback in accordance with an embodiment of the present technology.

FIG. 2 is a flow diagram illustrating an example method 200 of operating devices (e.g., devices illustrated in FIGS. 1A, 1B, and/or 1C) for an input quality check and feedback in accordance with an embodiment of the present technology. The example method 200 can correspond to operations of a computing device or system. As described in detail below, the apparatus 100 can include a DRAM that is electrically coupled to the apparatus controller 102 (e.g., a memory controller, a buffer, a repeater device, such as an RCD, etc.). The memory controller and the DRAM can interact with each other in real-time, such as during system initialization and/or actual use by an end-user, to check and adjust one or more exchanged signals (e.g., a clock signal). The memory controller and the DRAM can use the interactions to measure, communicate, and assess one or more actual traits or qualities (e.g., as perceived by a receiving circuit) in real-time. The memory controller and the DRAM can use the resulting assessments to adjust the one or more exchanged signals, thereby enhancing throughput/operating speeds and/or reducing errors for the memory controller and the DRAM.

At block 202, the memory controller can initiate the input quality check mode, such as by issuing an operation command. The memory controller can be configured to initiate the input quality check during real-time operation of the corresponding system/environment. For example, the memory controller can be configured to initiate the input quality check upon system power-up or the corresponding system initialization. Additionally or alternatively, the memory controller can initiate based on a signal (e.g., a dedicated request, an error measure, or the like) from the DRAM.

At block 204, the apparatus 100 can enter the input quality check mode in response to the initiating command from the memory controller. While the apparatus 100 is in the input quality check mode, the memory controller can provide measurement targets, such as the clock signal, to the apparatus 100 as illustrated at block 203. The memory controller can be configured to wait a predetermined period between initiation and sending the measurement targets. Accordingly, the apparatus 100 can be configured to expect the measurement targets based on the predetermined period. The apparatus 100 can observe the measurement targets and determine the quality thereof. The apparatus 100 can count the number of input transitions for a predetermined duration, adjust the buffer bias level, reset the counter, and repeat the count of the input transitions with the adjusted bias level. Details regarding the input quality check mode is described below.

At block 206, the apparatus 100 can provide feedback results to the memory controller regarding the quality of the received input clock. The memory controller and the DRAM can be configured to communicate the feedback results using one or more connections that are used for other communications for other or run-time operating modes. For example, the memory controller and the DRAM can use the DQ bus and circuitry to communicate a transition count, a quality measure, a corresponding DRAM die setting, or a combination thereof of as feedback.

At block 208, the memory controller can determine a communication circuit setting in response to the input quality feedback. For example, the memory controller can determine a clock speed, a clock signal level, a bus or a die termination setting, or a combination thereof according to the input quality feedback.

At block 210, the memory controller, the DRAM, or a combination thereof can establish the determined communication circuit setting across the communicating circuits. For example, the communicating circuits can communicate and implement the determined clock speed, signal level, the termination setting, or the like for improving the system operating speed, the error rate, or other performance measures.

FIG. 3 is a flow diagram illustrating an example method 300 of operating an apparatus (e.g., the apparatus 100 of FIG. 1A, such as using the address command input circuit 105 of FIG. 1B, the clock input circuit 120 of FIG. 1B, the internal clock circuit of FIG. 1B, and/or the I/O circuit 160 of FIG. 1B) for the input quality check and feedback in accordance with an embodiment of the present technology. In some embodiments, the method 300 can be for determining the quality of an input signal, such as the clock signal, received by a memory device (e.g., DRAM) and providing a real-time feedback. The method 300 can correspond to the input quality check mode (block 204) of FIG. 2, the input quality feedback (block 206) of FIG. 2, and/or other related processes described above.

At block 302, the memory can receive the operation command and enter the input quality check mode. The controller (e.g., the controller 102 of FIG. 2) can issue the operation command as described above for block 202 of FIG. 2, and the memory can respond as described above for block 204 of FIG. 2. Upon entering the input quality check mode, the memory can execute a predetermined sequence of operations using predetermined default communication settings, such as for adjustable voltage levels, thresholds, trims, termination settings, bias settings, or the like.

At block 304, the memory can count the number of input transitions (e.g., count a digital representation of an externally provided input) of the input signal for a set time period. The memory can use a signal receiving circuit (e.g., a buffer) to receive a targeted measurement signal, such as a clock signal. As described above, the memory controller can provide the targeted measurement signal to the memory.

The memory can count the number of transitions in the targeted memory signal using a comparator, a counter, and/or other circuits. The memory can include a trigger circuit that initiates the set time period immediately or according to a predetermined delay based on entering the input quality mode or a related trigger event. The memory can count the number of signal transitions for during the set time period, which can be tracked using a timer circuit (e.g., corresponding to a different external timing signal and/or an internal clock/oscillator circuit) corresponding to a predetermined length/duration for the measurement period.

At decision block 306, the memory can determine whether the set time period is complete. The memory can determine that the set time period is complete when the tracking timer circuit reaches a predetermined condition (e.g., 0 for a count-down design). If the set time period is not complete, the memory can continue to count input transitions (at block 304).

When the memory determines the set time period is complete, at block 308, the memory can control the signal-transition counter to stop. The memory can latch the count value (e.g., the number of transitions in the targeted signal detected by the input buffer) at a predetermined location. The latched count value can be used as a reference value representative of the default settings.

At block 310, the memory can reset the counter after latching the count value. In other words, the memory can clear the counter in preparation for additional counting/measurements for different communication settings.

At block 312, the memory can adjust one or more communication settings, such as the input buffer bias level, the communication path termination settings (e.g., the on-die termination (ODT) settings), threshold levels, or the like. In some embodiments, the memory can adjust the input buffer bias level to limit a low signal swing of the clock input signal from entering through the input buffer and registering as a clock transition. In other words, the memory can adjust the communication settings, such as the input buffer bias level, to examine the real-time quality of the clock signal. If the real-time quality of the clock signal corresponds to lower voltage levels or amplitude or other lower quality conditions, enhanced communication settings (e.g., higher bias levels, lower thresholds, lower speeds) may be required to detect signal levels/transitions. For lower quality signals, relaxed or higher-speed communication settings may be unable to detect the signal levels and transitions. Accordingly, the memory can adjust one or more communication setting according to a predetermined pattern.

At block 314, the memory can count the number of input transitions of the input signal with the adjusted communication setting for a set time period. The measurement target signal (e.g., the clock signal) can be provided to the memory using a known pattern. Similar to block 304, the memory can count the number of input transitions for the set time period.

At decision block 316, the memory can determine whether the set time period is complete. Similar to the processes for block 306, the memory can continue to count input transitions (at block 314) of the input signal during the set time period (e.g., as indicated by a timer).

When the set time period is complete, as illustrated at block 318, the memory can stop the input transition counter. The memory can compare the reference count, from the prior/initially latched count value, (from block 308) to the currently resulting count with the adjusted communication setting.

At block 320, the memory can latch the compare results. For example, the memory can latch the difference in the counts, the sign (e.g., negative or positive) of the difference in counts, or other related measures related to the comparison. The memory can latch the comparison results at a predetermined location. Alternatively or additionally, the memory can latch the transition count for the adjusted setting along with or instead of the comparison result.

At decision block 322, the memory can determine whether the adjustment level of the input buffer bias is at a threshold (e.g., maximum count). The memory can determine if multiple adjustment levels of the input buffer bias are needed before the threshold is reached. In other words, the memory can be configured to observe the input signal (by, e.g., counting the signal transitions) using a predetermined set of communication settings/combinations. At decision block 322, the memory can determine whether all/last of the predetermined communication settings/combinations have been tested.

If the adjustment level of the input buffer is not at the threshold, at block 324, the memory can make an increment adjustment and reset the counter (return to block 314). In other words, the memory can iteratively observe the input signal (via, e.g., counting the signal transitions) across the predetermined set of communication settings. The memory can latch the count value of input transition of each of the additional adjustments to the input buffer bias and compare the values to the reference count value (from block 318 and 320).

If the adjustment level of the input buffer is at the threshold, at block 326, the memory can send the results of observing the input quality to the memory controller. For example, the memory can send the latched compare results, the count results, or a derivation thereof to the controller. For example, the memory can send a code representative of a channel state, a condition, or a quality of the signal that is derived using the different transition counts in comparison to the reference count value. In some embodiments, the memory can communicate the quality check results using communication medium or connections that may be configured to communicate other data during regular operation. For example, the memory can use the DQ pins of I/O circuit 160 of FIG. 1 to communicate the quality check results during the input quality mode.

At block 328, the memory can reset the reference count value and comparison values (return to block 304). For example, the memory can exit the input quality loop by toggling a reset command (e.g., reset_n) or removing power to the counter. The process can be ended (at block 330) after one full iteration in some embodiments. In other embodiments, the process can end based on a corresponding end command or a removal of the input quality mode enable signal. The memory controller may review the communicated compare results, adjust some overall circuit settings (e.g., coordinate ODT settings across multiple DRAMs on the shared clock line, such as for DIMMs), and reinitiate the input quality check.

Figure 4A:
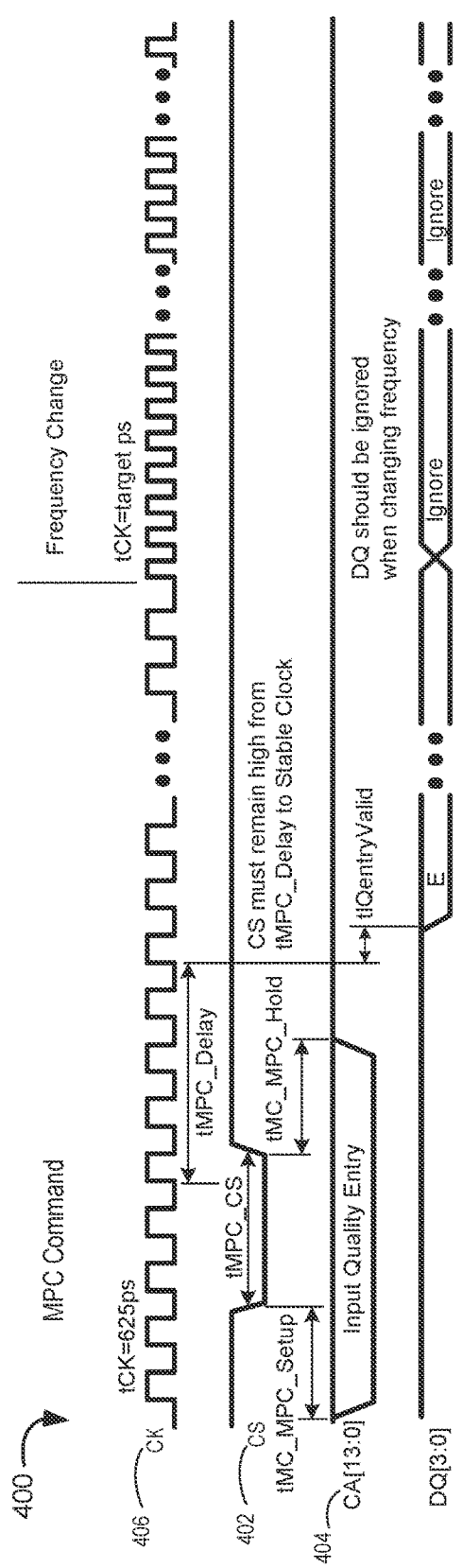
FIGS. 4A, 4B, and 4C are example timing diagrams illustrating the input quality check and feedback in accordance with an embodiment of the present technology.
Figure 4B:
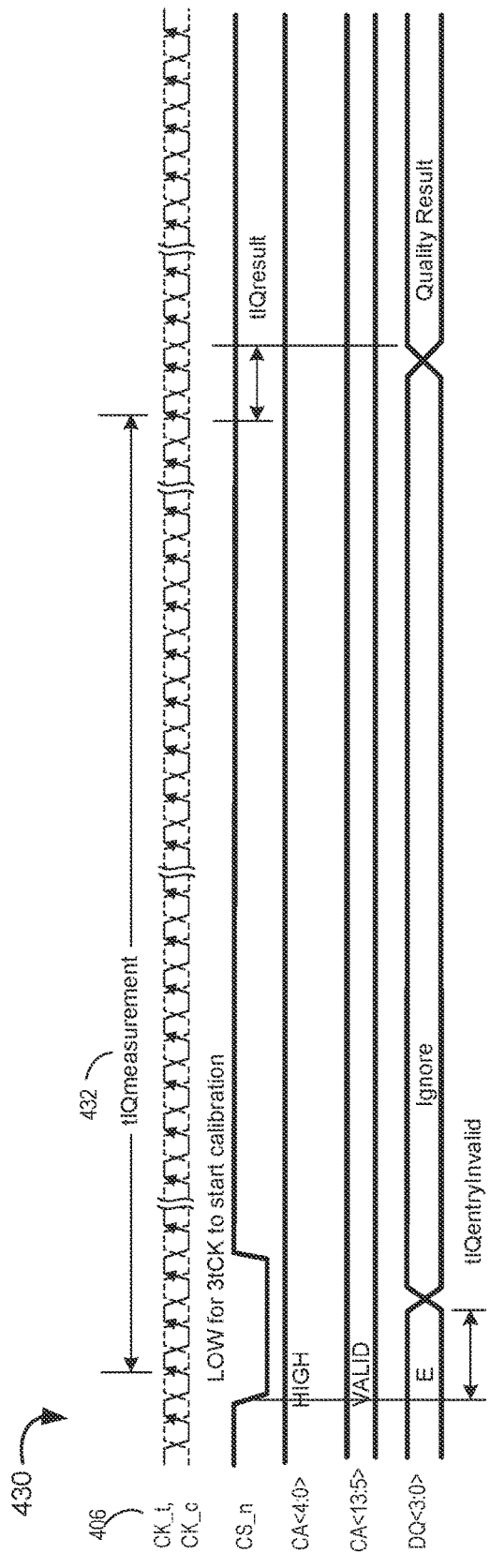
Figure 4C:
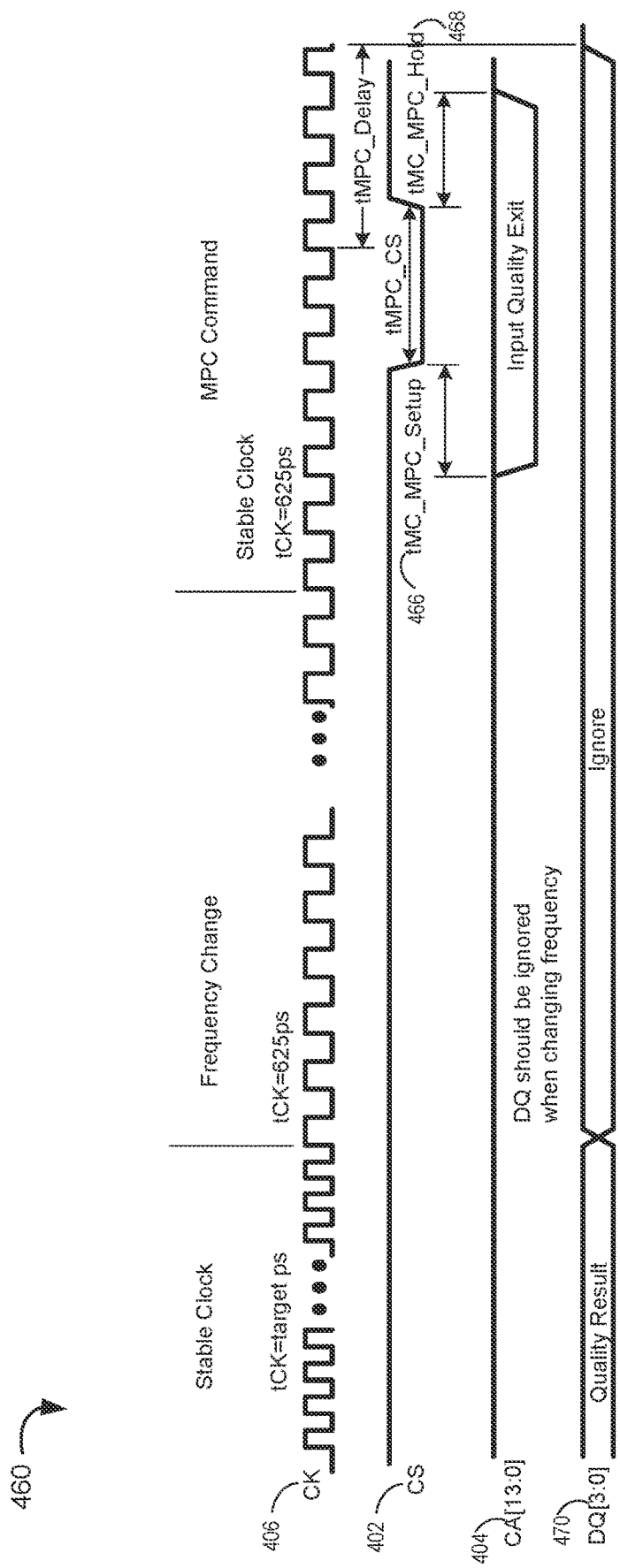

FIGS. 4A, 4B, and 4C are example timing diagrams illustrating the input quality check and feedback in accordance with an embodiment of the present technology. FIG. 4A is an example of a timing diagram 400 illustrating example signals for entering into an input quality check mode. The chip select (illustrated by CS 402) and command address (illustrated by CA 404) can be used to initiate the input quality check mode. For example, the controller 102 of FIG. 2 can use the CS 402 and the CA 404 to issue the operation command to implement the input quality check mode at one of the DRAMs 100 of FIG. 1C on a DIMM. In response, the corresponding memory device (e.g., apparatus 100) can count the number of input transitions of a clock signal 406 for a set time period as described above. In some embodiments, the controller 102 can implement one or more frequency changes in the clock signal 406 according to a predetermined sequence. Accordingly, the controller 102 and the memory device can test multiple settings/frequencies during one or more implementations of the input quality check mode. As described in further detail below, the memory device can be configured to initiate the counting operation based on one or more predetermined delays, such as a tMPC_Delay, a tMC_MPC_Hold, a tIQentryValid duration, or the like relative to the CS 402 and/or the CA 404.

FIG. 4B is an example of a timing diagram 430 illustrating an input quality measurement during the input quality check mode. The responding memory device (e.g., apparatus 100) can count the number of input transitions of the clock signal 406 (e.g., CK_t and CK_c) for a set time period (e.g., tlQmeasurement 432). The tlQmeasurement 432 can be tracked based on the CS 402 (e.g., the CS_n) and the CA 404 (e.g., the CA<13:5>). For example, the memory device can begin tracking the tlQmeasurement 432 and count the number of input transitions of the clock signal 406 when the CS 402 and the CA 404 indicate the input quality check mode for three transitions of the clock signal 406. The memory device can provide the quality measurement result after a predetermined duration (e.g., tlQresult) following the end of the tlQmeasurement 432. The memory device can use the DQ circuit (e.g., DQ<3:0>) to provide the quality measurement result to the controller 102.

FIG. 4C is an example of a timing diagram 460 illustrating an exit portion of the input quality check mode. In some embodiments, after a memory device (e.g., apparatus 100) performs the quality measurement by counting the input transitions of the clock signal 406, the CS 402 and the CA 404 can be used to initiate the input quality exit. For example, the input quality exit command can be provided on the CA 404 for a duration (e.g., tMC_MPC_Setup 466). Upon reading the command, the receiving memory device(s) can prepare to implement the input quality exit. When the CS 404 is activated (by, e.g., transitioning low) after the tMC_MPC_Setup 466 duration and maintained for a duration tMPC_CS, the corresponding memory device can implement the input quality exit. In some embodiments, the CA 404 may be maintained for a tMC_MPC_Hold duration following the CS 402 activation. Based on the CA 404 and/or the CS 402 (e.g., according to a tMPC_Delay), the memory device can terminate the measurement portion of the input quality check mode. When the input quality exit is complete at command tMC_MPC_Hold 468, the memory device can send the results of the input quality check on a DQ output path (illustrated by DQ 470).

Figure 5:
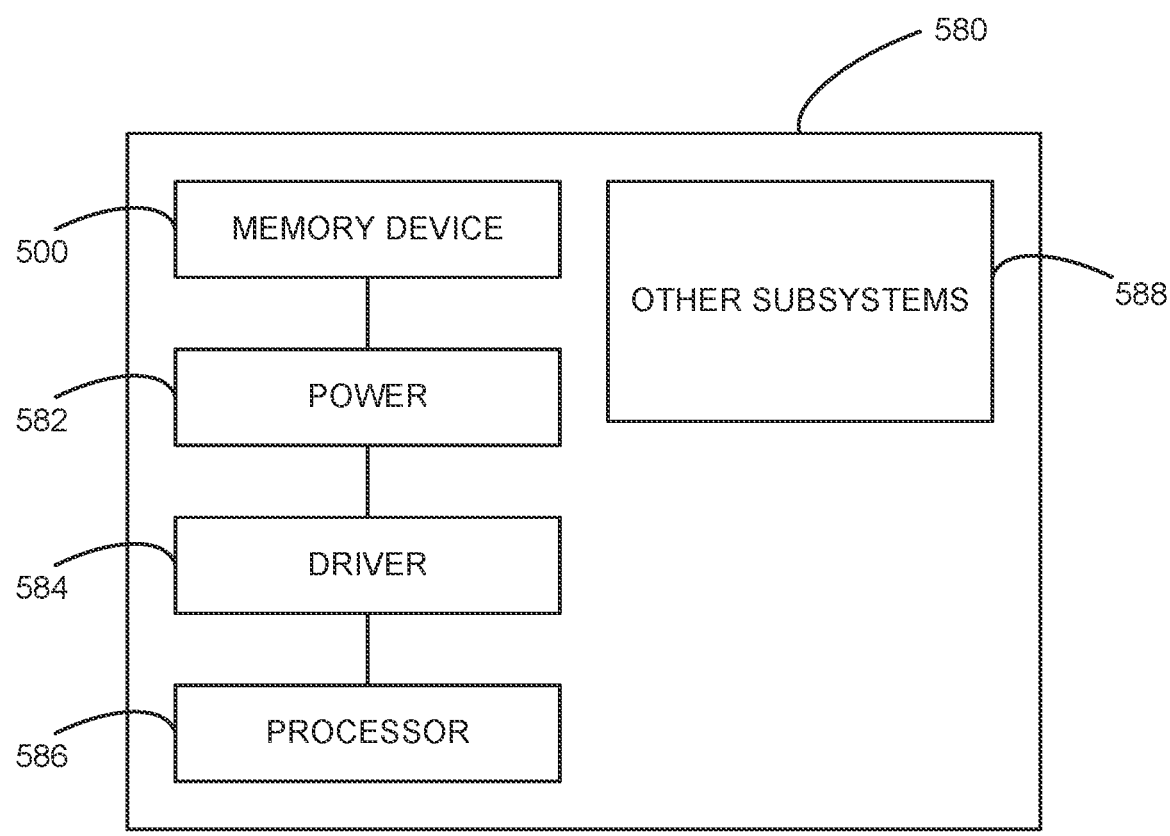
FIG. 5 is a schematic view of a system that includes an apparatus in accordance with an embodiment of the present technology.

FIG. 5 is a schematic view of a system that includes an apparatus in accordance with embodiments of the present technology. Any one of the foregoing apparatuses (e.g., memory devices) described above with reference to FIGS. 1-4 can be incorporated into any of a myriad of larger and/or more complex systems, a representative example of which is system 580 shown schematically in FIG. 5. The system 580 can include a memory device 500, a power source 582, a driver 584, a processor 586, and/or other subsystems or components 588. The memory device 500 can include features generally similar to those of the apparatus described above with reference to FIGS. 1-4, and can therefore include various features for performing a direct read request from a host device. The resulting system 580 can perform any of a wide variety of functions, such as memory storage, data processing, and/or other suitable functions. Accordingly, representative systems 580 can include, without limitation, hand-held devices (e.g., mobile phones, tablets, digital readers, and digital audio players), computers, vehicles, appliances and other products. Components of the system 580 may be housed in a single unit or distributed over multiple, interconnected units (e.g., through a communications network). The components of the system 580 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-5.

We claim:
1. An apparatus, comprising:
   a communication buffer configured to receive a clock signal from an external controller;
   a logic circuit coupled to the communication buffer and configured to:
     count a first number of input transitions of the clock signal for a set time period;
     store in one or more sets of latches a count value of the first number of input transitions;
     adjust an input bias level for the communication buffer after counting the first number of input transitions;
     count a second number of input transitions of the clock signal for the set time period using the adjusted input bias level;
     generate a comparison result based on the second number of input transitions and the first number of input transitions; and
   a data communication circuit coupled to the logic circuit and configured to:
     send the comparison result to the external controller.
2. The apparatus of claim 1, wherein the apparatus is further configured to:
   determine that the set time period is complete; and
   in response to completing the set time period, store in the one or more sets of latches the count value of the first number of input transitions.

3. The apparatus of claim 1, wherein the apparatus is further configured to:
determine adjustments to the input bias level for the communication buffer are at a threshold; and
store in the one or more sets of latches the comparison result based on the second number of input transitions and the first number of input transitions.

4. The apparatus of claim 1, wherein the apparatus is further configured to:
determine a strength measurement of the clock signal based on the comparison result of the second number of input transitions and the first number of input transitions.

5. The apparatus of claim 1, wherein the apparatus is further configured to:
determine a communication circuit setting in response to the comparison result.

6. The apparatus of claim 1, wherein the data communication circuit is a DQ output circuit that is used the send the comparison result to the external controller.

7. The apparatus of claim 1, wherein the apparatus is a dynamic random-access memory (DRAM) that is coupled to the external controller that comprises a compute express link (CXL) controller.

8. A system, comprising:
a controller coupled to a memory array, the controller configured to:
send a clock signal to the memory array;
the memory array operably coupled to at least one processor and configured to:
count a first number of input transitions of the clock signal for a set time period;
store in one or more sets of latches a count value of the first number of input transitions;
adjust an input bias level for a communication buffer after counting the first number of input transitions;
count a second number of input transitions of the clock signal for the set time period using the adjusted input bias level;
generate a comparison result based on the second number of input transitions and the first number of input transitions; and
send the comparison result to the controller.

9. The system of claim 8, wherein the memory array is further configured to:
determine that the set time period is complete; and
in response to completing the set time period, store in the one or more sets of latches the count value of the first number of input transitions.

10. The system of claim 8, wherein the memory array is further configured to:
determine adjustments to the input bias level for the communication buffer are at a threshold; and
store in the one or more sets of latches the comparison result based on the second number of input transitions and the first number of input transitions.

11. The system of claim 8, wherein the memory array is further configured to:
determine a strength measurement of the clock signal based on the comparison result of the second number of input transitions and the first number of input transitions.

12. The system of claim 8, wherein the memory array is further configured to:
determine a communication circuit setting in response to the comparison result.

13. The system of claim 8, wherein the memory array uses a DQ output circuit to send the comparison result to the controller.

14. The system of claim 8, wherein:
the memory array is a dynamic random-access memory (DRAM); and
the controller is a compute express link (CXL) controller.

15. A method of operating an apparatus, the method comprising:
counting a first number of input transitions of a clock signal for a set time period;
storing in one or more sets of latches a count value of the first number of input transitions;
adjusting an input bias level for a communication buffer after counting the first number of input transitions;
counting a second number of input transitions of the clock signal for the set time period using the adjusted input bias level;
generating a comparison result based on the second number of input transitions and the first number of input transitions; and
sending the comparison result to an external controller.

16. The method of claim 15, further comprising:
determining that the set time period is complete; and
in response to completing the set time period, storing in the one or more sets of latches the count value of the first number of input transitions.

17. The method of claim 15, further comprising:
determining adjustments to the input bias level for the communication buffer are at a threshold; and
storing in the one or more sets of latches the comparison result based on the second number of input transitions and the first number of input transitions.

18. The method of claim 15, further comprising:
determining a strength measurement of the clock signal based on the comparison result of the second number of input transitions and the first number of input transitions.

19. The method of claim 15, further comprising:
determining a communication circuit setting in response to the comparison result.

20. The method of claim 15, wherein a DQ output circuit is used to send the comparison result to the external controller.

* * * * *